US005623241A

United States Patent [19]
Minkoff

[11] Patent Number: 5,623,241
[45] Date of Patent: Apr. 22, 1997

[54] PERMANENT MAGNETIC STRUCTURE

[75] Inventor: Lawrence A. Minkoff, Lattingtown, N.Y.

[73] Assignee: Magna-Lab, Inc., Hicksville, N.Y.

[21] Appl. No.: 424,246

[22] Filed: Apr. 17, 1995

Related U.S. Application Data

[63] Continuation of Ser. No. 943,860, Sep. 11, 1992, abandoned.
[51] Int. Cl.$^6$ .............................. H01F 1/00; H01F 7/02; G01V 3/00
[52] U.S. Cl. ..................... 335/296; 335/302; 324/319
[58] Field of Search .......................... 335/296, 297, 335/298, 299, 300, 302, 306; 324/319

[56] References Cited

U.S. PATENT DOCUMENTS

| | | | |
|---|---|---|---|
| 3,017,544 | 1/1962 | Kane | 335/296 |
| 3,018,422 | 1/1962 | Seaton | 335/296 |
| 3,205,415 | 9/1965 | Seki et al. . | |
| 3,662,304 | 5/1972 | Bringe | 335/297 |
| 3,839,797 | 10/1974 | Randolph | 32/67 |
| 4,240,439 | 12/1980 | Abe et al. . | |
| 4,578,663 | 3/1986 | Sanders et al. . | |
| 4,608,991 | 9/1986 | Rollwitz . | |
| 4,613,926 | 9/1986 | Heitman et al. . | |
| 4,679,022 | 7/1987 | Miyamoto et al. . | |
| 4,689,591 | 8/1987 | McDougall . | |
| 4,723,116 | 2/1988 | Mueller et al. . | |
| 4,748,414 | 5/1988 | Knuttel | 324/318 |
| 4,870,380 | 9/1989 | McGinley | 335/296 |
| 5,063,934 | 11/1991 | Rapoport | 128/653.5 |
| 5,153,546 | 10/1992 | Laskaris | 335/216 |

Primary Examiner—Leo P. Picard
Assistant Examiner—Stephen T. Ryan
Attorney, Agent, or Firm—Darby & Darby

[57] ABSTRACT

A permanent magnet structure includes a generally shaped frame made of a magnetic material and a pair of opposite polarity magnet members mounted on the opposed surfaces of the legs of the U. The connecting element of the U which connects the legs, is disposed at a sufficient distance from the magnets so that the resulting magnetic field passes substantially entirely between the magnets and through the arms and so that no substantial eddy currents are induced in the connecting element during imaging. Between the connecting element and the magnets, there is disposed a non-conductive, non-magnetic separating member which contacts the two arms and tends to keep them apart. The separating member is so positioned relative to the connecting member and the magnets that effects of the force between the two magnets and the force produced by the magnetic field passing through the arms and connecting element are counterbalanced. This results in a structure which is mechanically stable.

4 Claims, 2 Drawing Sheets

5,623,241

PERMANENT MAGNETIC STRUCTURE

This is a continuation of application Ser. No. 7/943,860, filed Sept. 11, 1992, now abandoned.

FIELD OF THE INVENTION

The present invention relates generally to permanent magnet structures and, more particularly, concerns a permanent magnet structure useful in magnetic resonance imaging (MRI) devices.

BACKGROUND OF THE INVENTION

MRI devices utilize large permanent magnets to generate the very substantial magnetic fields to which the patient is exposed. Successful imaging requires that the magnetic field have predictable characteristics and be as uniformed as possible. A typical MRI magnet utilizes a pair of planar magnets of opposite polarity which are maintained in an opposed, spaced-apart relationship by a supporting frame, so that the patient may be placed in the gap between the two magnets. The frame is typically U-shaped in cross-section, with the magnets being mounted on the inside of the opposite legs of the U. The frame is made of a highly permeable magnetic material, such as steel, so as to provide a return path for the magnetic flux between the two magnets.

During the construction of the magnet structure, great care is taken to mount the magnets so as to achieve the desired uniform field. However, the strong field between the magnets produces a very large force, which tend to pull the two arms of the U-frame together. If this force were to so distort the frame, the relative orientation of the two magnets would be changed and the uniformity of the magnetic field would be adversely affected. In order to avoid such distortion of the frame, it is constructed so as to be particularly heavy and rigid. Unfortunately, this often makes the magnet structure bulky and difficult to handle, as well as expensive.

Broadly, it is an object of the present invention to provide a magnet structure useful for MRI devices which avoids the shortcomings of known structures of this type. It is specifically contemplated that a substantially smaller and lighter structure be provided so as to be readily transported and moved into different locations and positions for use.

It is also an object of the present invention to provide a permanent magnet structure useful in MRI devices which is reliable and convenient in use, yet relatively inexpensive in construction.

In accordance with the present invention, a permanent magnet structure includes a generally U-shaped frame made of a magnetic material and a pair of opposite polarity magnet members mounted on the opposed surfaces of the legs of the U. The connecting element of the U, which connects the legs, is disposed at a sufficient distance from the magnets so that the resulting magnetic field passes substantially entirely between the magnets and through the arms and so that no substantial eddy currents are induced in the connecting element by the imagining system gradient coils during imagining. Between the connecting element and the magnets, there is disposed a non-conductive, non-magnetic separating member which contacts the two arms and tends to keep them apart. The separating member is so positioned relative to the connecting member and the magnets that affects the force between the two magnets and the force produced by the magnetic field passing through the arms and connecting element are counterbalanced. This results in a structure which is mechanically stable.

BRIEF DESCRIPTION OF THE DRAWINGS

The foregoing brief description, as well as further objects, features and advantages of the present invention will be understood more completely from the following detailed description of presently preferred, but nonetheless illustrative, embodiments of the present invention, with reference being had to the accompanying drawings in which.

DETAILED DESCRIPTION OF THE PREFERRED EMBODIMENTS

Figure 1:
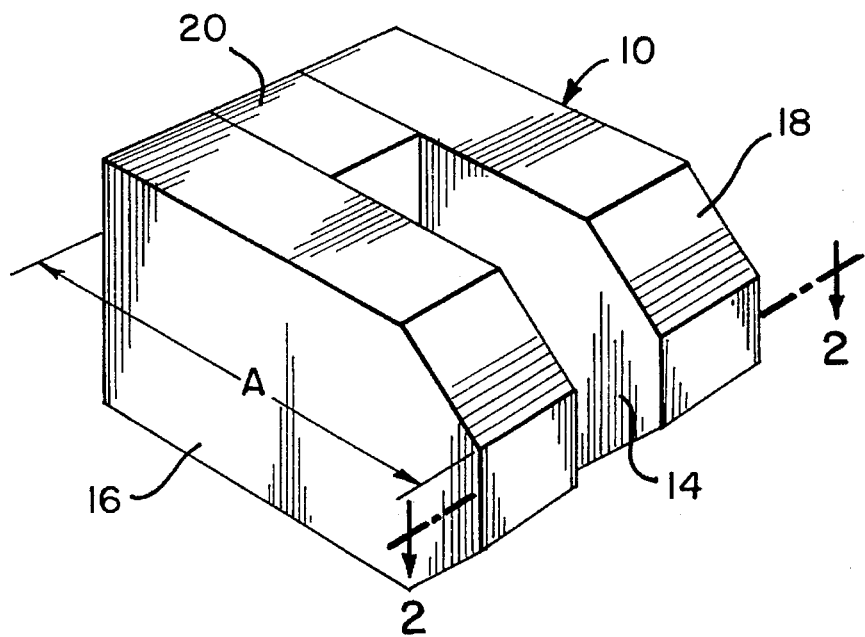
FIG. 1 is a perspective view illustrating the general appearance of a magnet structure embodying the present invention.
Figure 2:
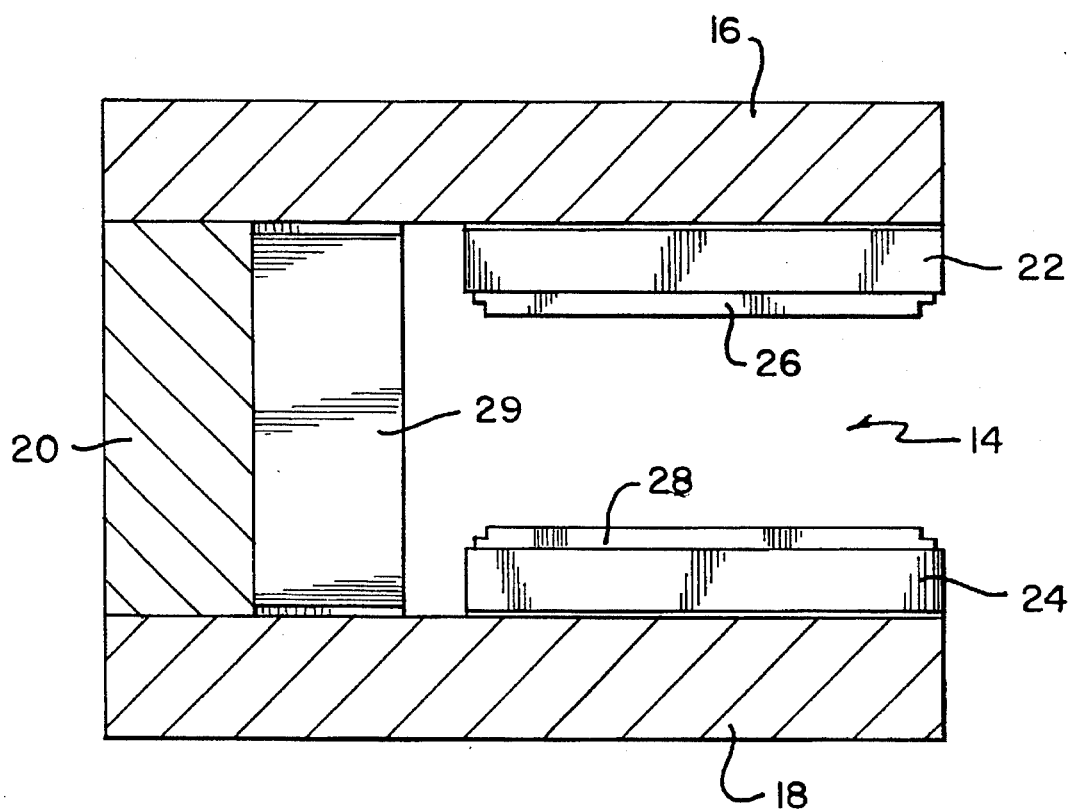
FIG. 2 is a top sectional view of the magnet structure of FIG. 1 taken along a plane 2—2.

Referring now to the details of the drawings, FIG. 1 is a perspective view showing the general shape of a magnet structure 10 embodying the present invention. In FIG. 2, the same structure is shown in a cross-sectional top view taken along a plane which bisects the structure vertically to show further details of the construction. The particular embodiment illustrated in FIGS. 1 and 2 is intended for veterinary and medical applications. In this embodiment, the dimension A is preferably 40 inches, the height is preferably 25 inches, the depth is preferably 31 inches, the height of the portion 12 is preferably 9 inches, and the depth of the channel opening 14 is preferably also 9 inches. The magnet structure 10 would be used in association of the electrical components of an MRI device to scan a limb which is placed inside the opening 14 (see FIG. 3).

As can be seen in FIG. 2, the magnet structure 10 is generally U-shaped, being comprised of the arms 16, 18 and the cross-element 20 which connects the arms 16–18 at one end. The arms 16 and 18 are joined to the cross-element 20 by conventional means, such as screws.

On the opposed, inner surfaces of the arms 16, 18 are mounted oppositely poled magnet elements 22, 24, which are of a permanently magnetized material. The oppose surfaces of the magnet members 22, 24 are provided with pole pieces 26, 28 made of a magnetic material, preferably steel. The elements 16, 18, and 20 are also preferably made of steel or another magnetic material, so as to provide a low reluctance return path for the magnetic field which appears between the pole pieces 26, 28.

As has already been explained, it is the object of magnet structures used for MRI application to provide as uniform a magnetic field as possible in the area of gap 14. If the cross-element 20 is placed too close to the magnets 22, 24 it will distort the magnetic field between them and prevent it from being uniform. Also, the element 20 must be removed sufficiently far from the magnets 22, 24 to avoid having eddy currents induced in it during imagining, which currents would also distort the magnetic field in the gap 14. Accordingly, a typical MRI magnet structure would have the arms 16, 18 substantially cantilevered with respect to the cross-element 20. Inasmuch as the magnets 22, 24 are usually quite powerful, a substantial attractive force exists between the arms 16,18. Accordingly, these arms must be made sufficiently heavy and rigid to avoid bending, which would bring the pole pieces 26, 28 out of a parallel alignment, distorting the field between them.

It should be noted that the force exerted between the magnets 22, 24 also tends to rotate the arms 16, 18 with respect to the cross-element 20. Accordingly, the fasteners securing the arms 16, 18 to the element, must also be quite heavy and strong and all of the elements must be made sufficiently large to accept large enough fasteners. Moreover, the cross-element 20 must be made substantially rigid and heavy so as to avoid bending. It is fortunate, however, that all of the force required to hold the elements 16, 18, and 20 together is not borne by the fasteners, since the magnetic flux through the elements produces forces which hold the elements, 16, 18, and 20 together.

From the above description, it will be appreciated that a conventional magnet structure (one without the additional features to be described below) is constantly in a state of stress, and the danger always exists that, through the introduction of magnetic material between the pole pieces 26, 28 the force could be increased sufficiently to overstress the fasteners and cause the arms 16, 18 to collapse together. This could prove to be particularly unpleasant if the piece of magnetic material is being carried by an individual who happens to be located between the arms. The possibility of physical injury is therefore ever present.

In accordance with the present invention, a separating member 29 which is not electrically conductive and is non-magnetic is disposed intermediate the cross-element 20 and the magnets 22, 24 in contact with the opposed surfaces of arms 16 and 18. The separating member 29 is positioned so that the effect of the forces resulting from the magnetic fields is counterbalanced at the top and bottom of member 28. Specifically, the force between the magnets 22 and 24 exerts a moment at the top of member 29 which is opposite to the moment resulting from the force between the elements 16 and 20. In accordance with the present invention, the moment produced by the force between elements 16 and 20 must at least equal the moment produced by the other force. A similar situation must exist at the bottom of member 29. When so constructed, the magnet structure becomes stable, in that it would not collapse, even if there were no mechanical fasteners between elements 16 and 20 and between elements 18 and 20. The fasteners would, of course, be provided, but they no longer represent critical stress points.

It should also be appreciated that the force between magnets 22 and 24 has a shorter lever arm with respect to separating member 29 then it does with respect to cross-element 20. Accordingly, arms 16 and 18 need not be as rigid and can be made somewhat lighter and smaller. Similarly, separating member 28 prevents cross-element 20 from being subjected to bending, so that element 20 may be made smaller and lighter as well. Thus, the present invention not only results in a magnet structure which is stable, but also one which is smaller and lighter for a magnetic field of a given strength and uniformity between the pole pieces 26 and 28 (e.g. with the magnets 22 and 24 having a given strength and surface area).

Figure 3:
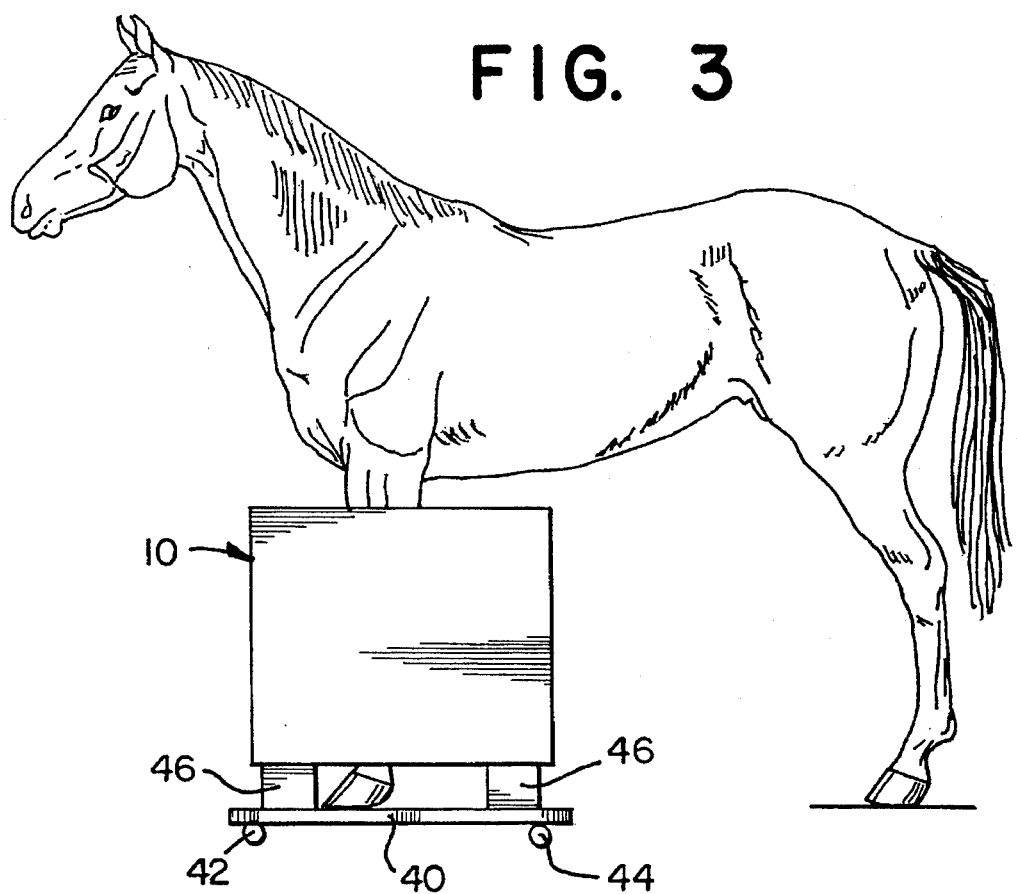
FIG. 3 illustrates how the magnet structure of Fig. 1 would be utilized in an MRI device to examine the leg of an animal.

As can be seen in FIG. 3, in accordance with the present invention, it becomes possible to provide a relatively small and light weight structure 10 which can be moved above on a platform 40 having wheels or casters 42, which permit it to be moved about. In addition, magnet 10 may be supported on platform 40 by means of lifting devices 44, 44 (e.g. hydraulically or mechanically operated jacks) which permit the magnet structure 10 to be raised and lowered in position. The MRI device including the magnet structure 10 may therefore be brought to the patient and adjusted to a appropriate height for use. As can be seen, this permits the particularly convenient scanning of animal limbs, such as horses' legs.

Figure 4:
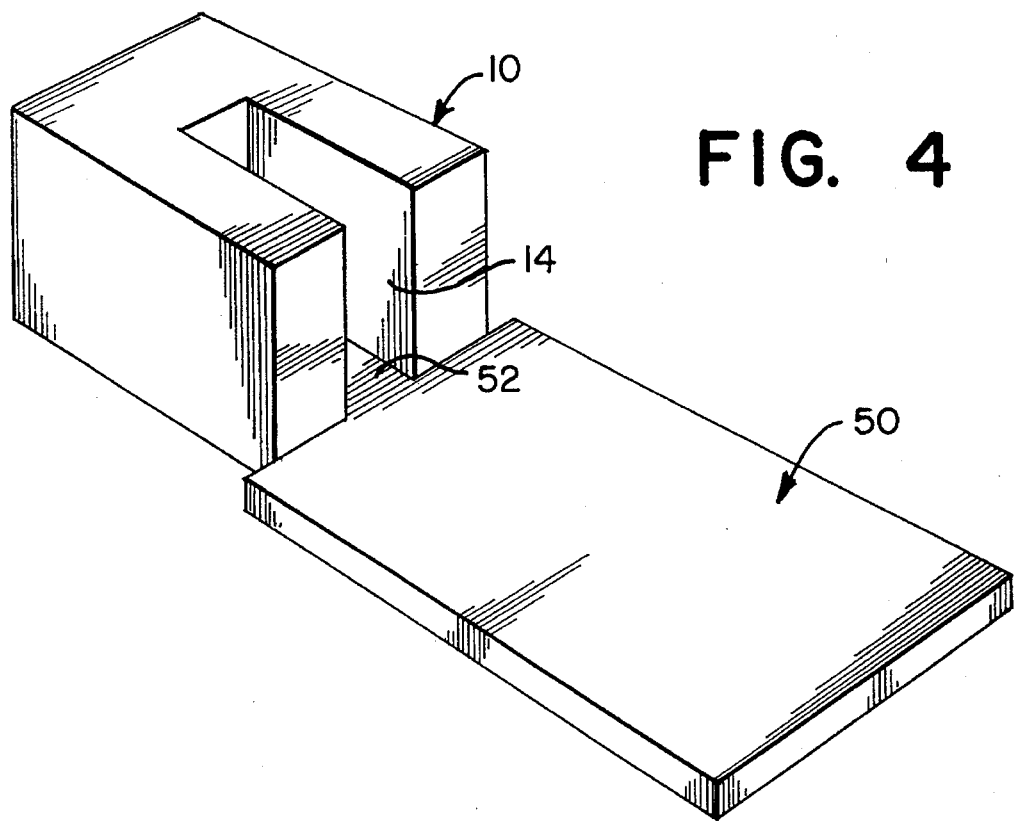
FIG. 4 is a perspective view illustrating a magnet structure such as shown in FIG. 1, in an MRI device useful for scanning the head of a patient.

FIG. 4 illustrates a magnet structure supported in relationship to an examining table 50 which has a forward extension 52 that protrudes into the gap 14 of the magnet structure. In this case, the gap 14 is preferably made large enough to accept the head of a patient. The patient may therefore lie down on the examining table 50 with his head supported on extension 52, to permit MRI scanning of the patient's head or extremities. A small size magnet is also particularly useful in pediatric applications, since it affords ready access to the child.

It should be stressed that, in addition to the advantages of size and weight offered by magnet structures in accordance with the present invention, another benefit is that a magnet structure is provided which is stress free and stable, so that the hazard of injury from collapse of the unit due to stress failure is eliminated.

Although preferred forms of the invention have been disclosed for illustrative purposes, those skilled in the art will appreciate that many additions, modifications and substitutions are possible, without departing from the scope and spirit of the invention as defined by the accompanying claims.

What is claimed is:

1. A permanent magnet structure comprising:

a generally U-shaped frame having spaced-apart arms in opposed to relationship and a cross-element connecting the arms at one end, the arms having opposing surfaces which face each other;

a permanent magnet mounted to each of the opposing surfaces to form a gap therebetween, the permanent magnets having opposite polarity and being spaced sufficiently far from said cross-element to avoid inducing any substantial eddy currents during imaging therein; and a separating member made of a non-magnetic, non-conductive material disposed intermediate the cross-element and the permanent magnets so as to be in contact with said opposing surfaces, the separating member being so positioned that the effect of forces resulting from the magnetic field produced by said magnets is counterbalanced at the top and bottom of said separating member.

2. In combination with the magnet structure of claim 1, a platform having supporting wheels and a raising and lowering mechanism supporting said magnet structure on said platform.

3. In combination with the magnet structure of claim 1, a platform for supporting a patient lying on the platform, the platform having a forward extension for receiving one of the head and extremities of a patient, the opposed faces of said arms being sufficiently far apart to permit the head of a patient to pass therebetween, the platform being supported in relationship to the magnet structure so that said forward extension extends into the gap between said opposed faces of said arms.

4. A method for stabilizing stresses in a permanent magnet structure of the type including a generally U-shaped frame having spaced-apart arms in opposed to relationship and a cross-element connecting the arms at one end, the arms having opposing surfaces which face each other, and a permanent magnet mounted to each of the opposing surfaces to form a gap therebetween, the permanent magnets having opposite polarity and being spaced sufficiently far from said cross-element to avoid inducing any substantial eddy currents during imaging therein, said method comprising the steps of:

provrding a separating member made of a non-magnetic, non-conductive material intermediate the cross-element and the permanent magnets so as to be in contact with said opposing surfaces; and positioning the separating member so that the effect of forces resulting from the magnetic field produced by said magnets is counterbalanced at the top and bottom of said separating member.

* * * * *